United States Patent [19]

Kasahara

[11] Patent Number: 5,285,462
[45] Date of Patent: Feb. 8, 1994

[54] LASER BEAM EMITTING DEVICE

[75] Inventor: Akihiro Kasahara, Kawasaki, Japan

[73] Assignee: Kabushiki Kaisha Toshiba, Kawasaki, Japan

[21] Appl. No.: 853,658

[22] Filed: Mar. 19, 1992

[30] Foreign Application Priority Data

May 21, 1991 [JP] Japan .................. 3-116096

[51] Int. Cl.[5] ............................... H01S 3/04
[52] U.S. Cl. ........................ 372/36; 257/359; 257/718
[58] Field of Search .............. 257/718, 719; 372/36

[56] References Cited

U.S. PATENT DOCUMENTS

| 3,038,703 | 6/1962 | Deakin | 257/718 |
| 3,823,351 | 7/1974 | Chambers | 257/718 |
| 4,768,070 | 8/1988 | Takizawa et al. | 372/36 |
| 5,048,050 | 9/1991 | Komurasaki | 372/108 |

FOREIGN PATENT DOCUMENTS 3-40478  2/1991  Japan .

Primary Examiner—James W. Davie
Attorney, Agent, or Firm—Finnegan, Henderson, Farabow, Garrett & Dunner

[57] ABSTRACT

A laser package is fixed by a fixing block in a mounting hole formed in an optical base. The laser package is pressed against the fixing block by a pressing plate and held between the pressing plate and the fixing block. A terminal insertion opening, into which a terminal for supplying power to a semiconductor laser 16 in a laser package is inserted, is formed in the central part of the pressing plate, and a convex portion is incorporated in the pressing plate, along a circumference of the terminal insertion opening.

10 Claims, 5 Drawing Sheets

LASER BEAM EMITTING DEVICE

BACKGROUND OF THE INVENTION

1. Field of the Invention

The present invention relates to a device for mounting a semiconductor laser used in an optical disk apparatus.

2. Description of the Related Art

In a conventional device for mounting a semiconductor laser, the semiconductor laser is incorporated in a laser package and mounted on an optical base. A mounting hole is formed in the optical base, and the laser package is fixed in the mounting hole by means of a fixing block. The fixing block is fixed on the optical base by screws, and the laser package is adhered to the fixing block by adhesive.

However, the above-described conventional device for mounting a semiconductor laser has the drawback that the adhesive is softened by heat from a semiconductor laser, which has a high power consumption, with the result that the laser package tends to move slightly from its proper fixing block. If the semiconductor laser is used in an optical disk apparatus, a displacement of the collimator or the optical axis may occur. If a high-frequency module is mounted on the laser package, the semiconductor laser may be moved by the weight of this module and the force applied by a harness, with the result that the optical characteristic of the semiconductor laser may be considerably degraded.

SUMMARY OF THE INVENTION

It is accordingly an object of the present invention to provide a device for mounting a laser beam emitting device wherein a laser beam emitting means is not moved due to heat or an external force.

A device for mounting a laser beam emitting device according to the present invention comprises a base having a mounting hole, laser beam emitting means fixed into the mounting hole by a mounting member, and a pressing member for pressing the laser beam emitting means against the mounting member so as to hold the laser beam emitting means firmly between it and the mounting member.

In the case of the device so constructed, the laser beam emitting means can be fixed in the mounting hole of the base without using adhesive.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

An embodiment of the present invention will be described, with reference to FIGS. 1 to 5.

Figure 1:
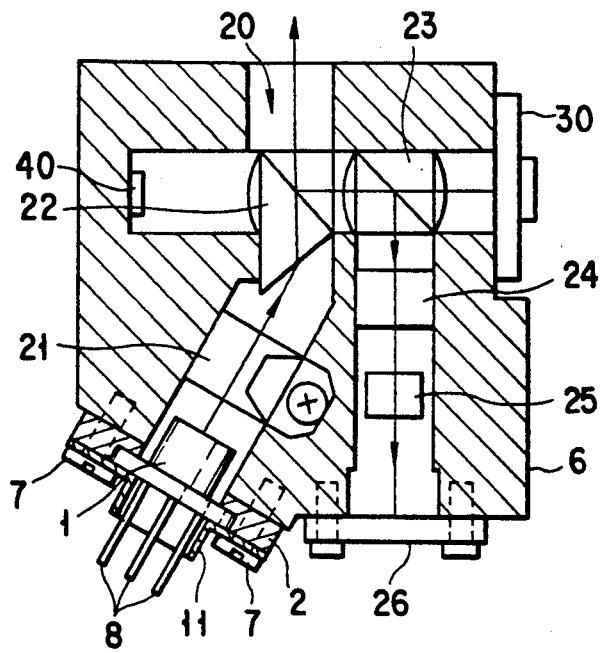
FIG. 1 is a cross-sectional view of an optical head according to an embodiment of the present invention.

FIG. 1 shows an optical head comprising a laser beam emitting means 1, an optical system 20, and a photo-detector device 26. The optical system 20 has a collimator lens 21, beam splitters 22 and 23, a focusing lens 24, and a cylindrical lens 25.

A laser beam emitted from the laser beam emitting means 1 is changed to parallel light by the collimator lens 21, and the parallel light passes through the beam splitter 22 and is led to an optical disk (not shown). The parallel light is reflected by the optical disk, then transmitted to the photo-detector device 16 via the beam splitters 22 and 23, focusing lens 24, and cylindrical lens 25, and converted into an optical signal. Data recorded in the optical disk is thus reproduced in response to the optical signal. The optical head also comprises photo-detectors 30 and 40 for adjusting. These photo-detectors are attached to an optical base 6.

Figure 2:
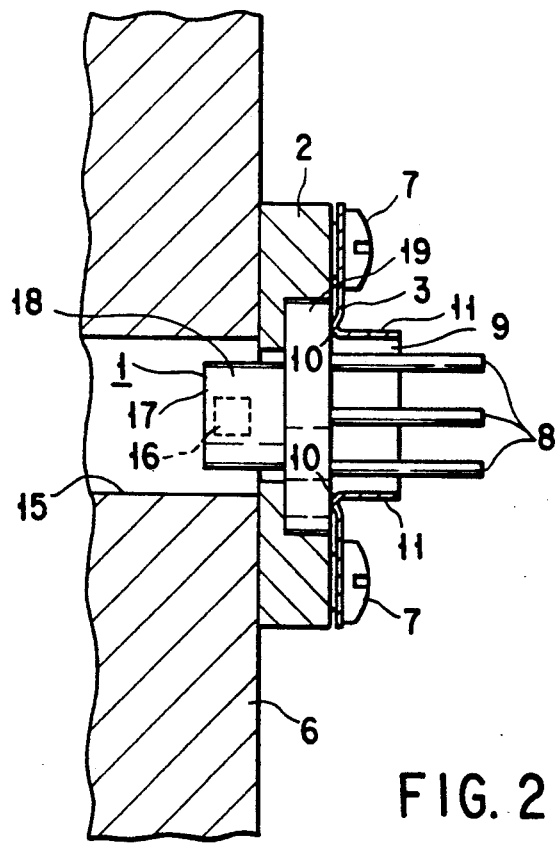
FIG. 2 is a cross-sectional side view showing a device for mounting a semiconductor laser, and used in the optical head shown in FIG. 1.

As shown in FIG. 2, the laser beam emitting means 1 is attached to the optical base 6. A mounting hole for guiding a laser beam emitted from the laser beam emitting means 115 is formed in the optical base 6, and the laser beam emitting means 1 is fixed into the mounting hole 15 by a fixing block 2 serving as a mounting member. The laser beam emitting means 1 includes a laser package 17 in which the semiconductor laser 16 is incorporated, and terminals 8 for supplying power to the semiconductor laser 16. The laser package 17 includes a circular section 18 having a small diameter serving as a front portion for emitting a laser beam and a circular section 19 having a large diameter serving as a heat sink and is pressed against the fixing block 2 by means of a pressing plate 3. The pressing plate 3 is fixed to the fixing block 2 by screws 7. A terminal insertion opening 9, into which the terminals 8 for supplying power to the semiconductor laser 16 in the laser package 17 are inserted, is formed in the central part of the pressing plate 3. A circular convex portion 10 is formed on the pressing plate 3 along the circumference of the terminal insertion opening 9. The circular section 19 of the laser package 17 is pressed against a step portion 31 of an insertion opening 32 by the circular convex portion 10. A cylindrical portion 11 is also formed along the circumference of the terminal insertion opening 9 so as to project from the pressing plate 3 in a direction opposite to the convex portion 10.

Figure 3:
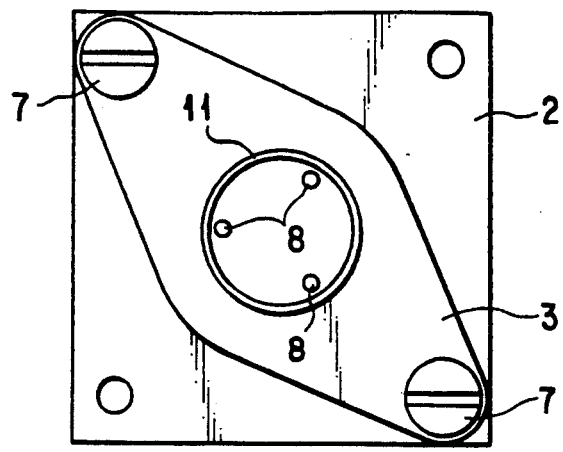
FIG. 3 is a front view of the device shown in FIG. 2.

FIG. 3 is a front view showing the pressing plate 3 fixed to the fixing block 2. The terminals 8 are inserted into the cylindrical portion 11 of the pressing plate 3.

Figure 4:
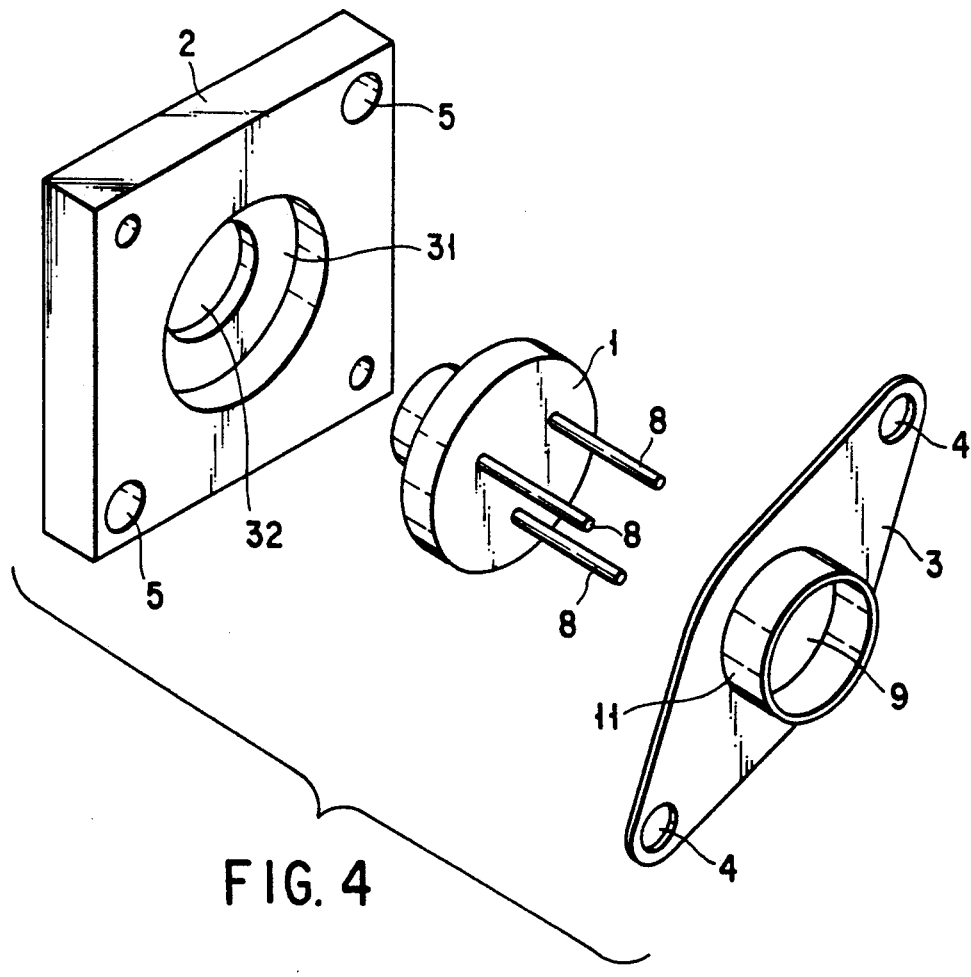
FIG. 4 is a perspective view of three parts of the device shown in FIG. 2.

FIG. 4 shows the fixing block 2, laser beam emitting means 1, and pressing plate 3, which are separated from one another. Through-holes 5 are formed in the corners of the fixing block 22, and through-holes 4 communicating with the through-holes 5 are formed at both ends of the pressing plate 3. The screws 7 are inserted into the through-holes 4 and 5 and screwed into tapped holes (not shown) of the optical base 6, with the result that the pressing plate 3 and fixing block 2 are fixed on the optical base 6. The fixing block 2 has the insertion opening 32. The insertion opening 32 has a cylindrical section 32a having a small diameter, a cylindrical section 32b having a large diameter, and the step portion 31 therebetween.

Thus, the laser package 17 is mechanically pressed and held by the fixing block 2 and the convex portion 10 of the pressing plate 3 which exerts a uniform pressure, thereby ensuring that the laser package 17 is securely fixed in place, and preventing it from being moved due to heat or an external force. If the laser package 17 were not pressed uniformly, it would likely incline. The stability of the laser package 17 is further enhanced by the fact that the cylindrical portion 11 is formed integral with the convex portion 10, thus endowing the convex portion 10 with superior rigidity.

Figure 5:
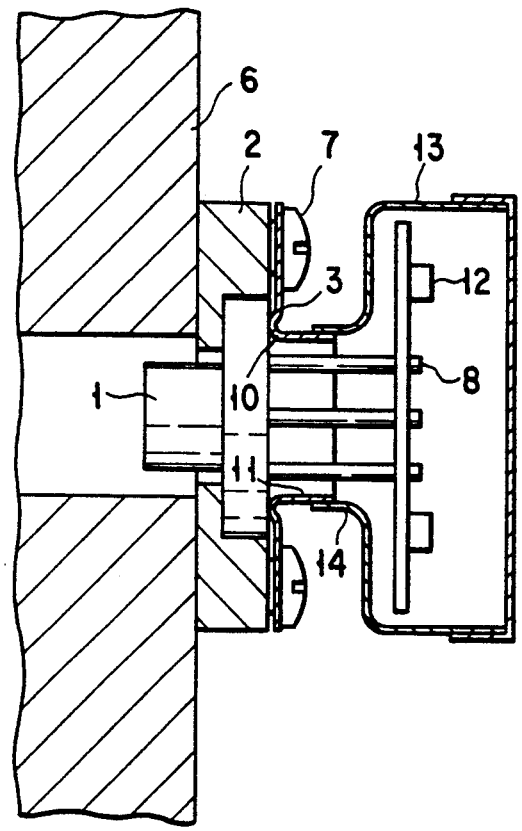
FIG. 5 is a cross-sectional side view of a shield package of a high-frequency module which is attached to the device shown in FIG. 2.

FIG. 5 shows a cylindrical portion 14 which projects from a shield package 13 of a high-frequency module 12 and is fitted to the cylindrical portion 11 of the pressing plate 3. The fitting of the cylindrical portions 11 and 14 allows the shield package 13 and high-frequency module 12 to be completely shielded from each other, thereby preventing noise from being added to radio waves.

Figure 6:
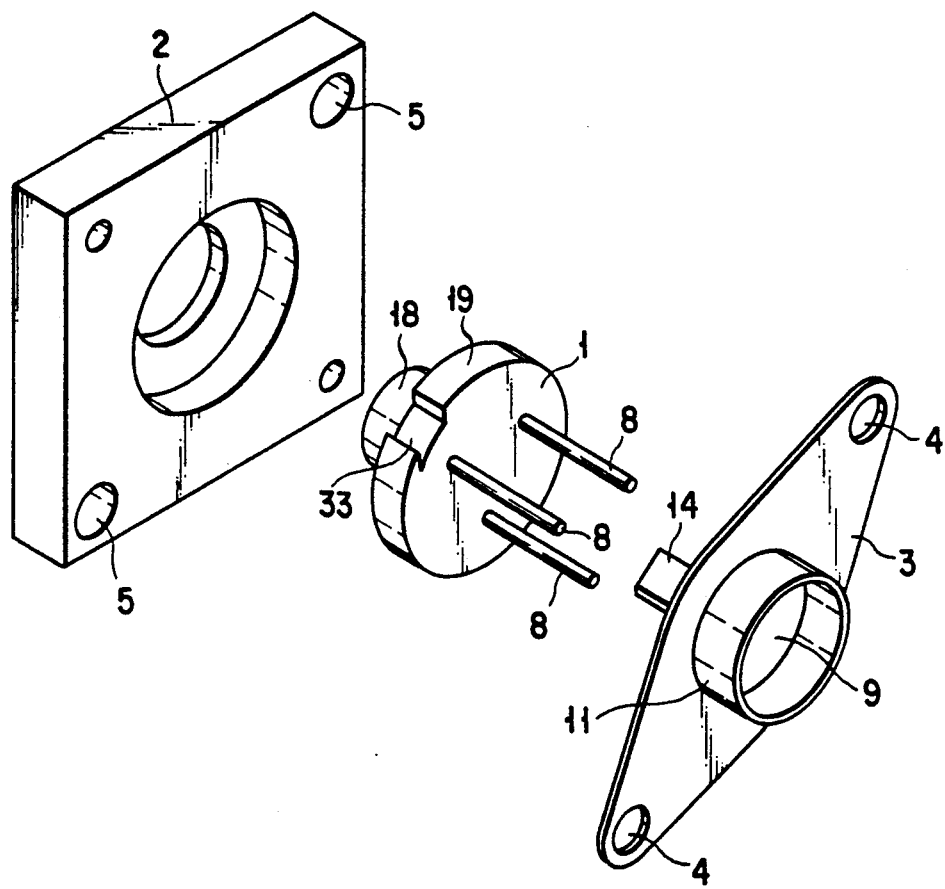
FIG. 6 is a perspective view of three parts of a device for mounting a semiconductor laser according to another embodiment of the present invention.

FIG. 6 shows another embodiment of the present invention. As shown in FIG. 6, a cylindrical portion 34 projects from one side of the pressing plate 3, and a cutaway portion 33 for positioning the laser beam emitting means is formed on the circumference of the circular section 19 of the laser package 17. When the laser package 17 is mounted, the cylindrical portion 14 of the pressing plate 3 is fitted into the cutaway portion 33 of the circular section 19. According to the embodiment shown in FIG. 6, since the direction of the laser package 17 is automatically determined, the semiconductor laser 16 can be mounted at a precise angle.

Figure 7:
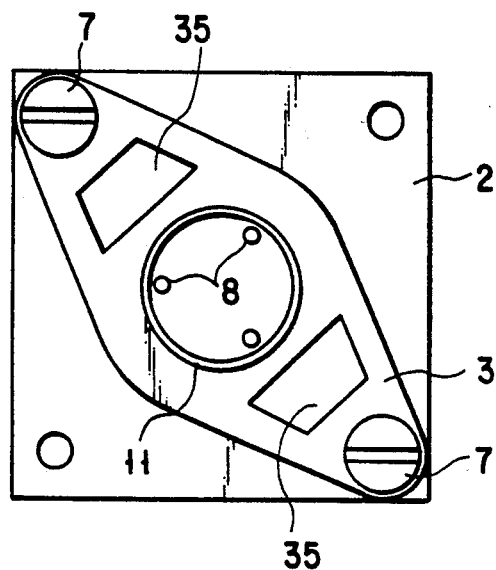
FIG. 7 is a front view of a device for mounting a semiconductor laser according to another embodiment of the present invention.
Figure 8:
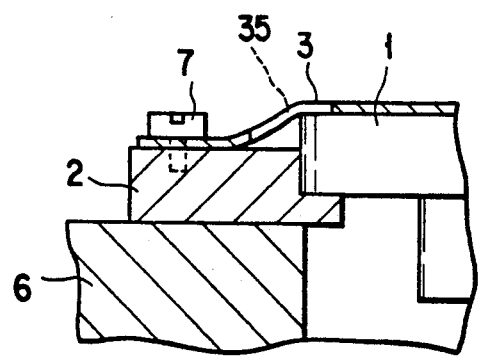
FIG. 8 is a view of a mounting state of a pressing plate of the device shown in FIG. 7.

FIG. 7 shows still another embodiment of the present invention. As shown in FIG. 7, paired slits 35, which are symmetrical with regard to the cylindrical portion 11, are formed on the surface of the pressing plate 3. With the slits so formed, the pressing plate 3 is easy to elastically deform when it is fixed to the fixing block 2 by the screws 7, as shown in FIG. 8. Therefore, the embodiment shown in FIG. 7 has the advantage that the pressing plate 3 can be fixed securely to the fixing block 2.

As described above, according to the present invention, the laser package 17, by being mechanically pressed against the fixing block 2 by the pressing plate 3, can be fixed securely to the fixing block without moving, with the result that there is no displacement of the collimator or the optical axis.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claim is:

1. A laser beam emitting device comprising:
   laser emitting means for emitting a laser beam;
   a base having a mounting hole for guiding the laser beam emitted from said laser emitting means;
   a mounting member for mounting said laser emitting means on said mounting hole; and
   a pressing member for pressing said laser emitting means against said mounting member, to hold said laser emitting means between the pressing member and the mounting member, said pressing member including a plate member having a convex portion by which said laser emitting means is pressed against said mounting member.

2. The laser beam emitting device according to claim 1, wherein the convex portion of said pressing member is formed like a ring in a central part of the plate member.

3. The laser beam emitting device according to claim 1, wherein said laser emitting means includes a front portion for emitting the laser beam and a back portion serving as a heat sink, said mounting member has an insertion hole communicating with said mounting hole, said insertion hole has a small-diameter cylindrical portion into which the front portion of said laser beam emitting means is inserted, a large-diameter cylindrical portion into which the back portion of said laser beam emitting means is inserted, and a step portion arranged therebetween, and wherein said back portion is pressed against said step portion by the convex portion of said plate member within the largediameter cylindrical portion.

4. The laser beam emitting device according to claim 1, wherein said pressing member has slits formed in a surface thereof.

5. The laser beam emitting device according to claim 1, wherein said laser emitting means includes a cutaway portion, and said pressing member includes a projection, engaged with the cutaway portion, for positioning said laser beam emitting means.

6. A laser beam emitting device comprising:
   laser beam emitting means for emitting a laser beam, said laser beam emitting means including a front portion for emitting the laser beam, a back portion serving as a heat sink, and an electrical connection terminal projected from the back portion;
   control means for controlling said laser beam emitting means, said control means having a high-frequency electrical circuit;
   a shield package for electrically shielding said control means, said shield package having a cylindrical portion projected therefrom, said high-frequency electrical circuit being connected to said electrical connection terminal through said cylindrical portion;
   a base having a mounting hole for guiding the laser beam emitted from said laser beam emitting means;
   a mounting member for mounting said laser beam emitting means on said mounting hole;
   a pressing member for pressing said laser beam emitting means against said mounting member, to hold said laser beam emitting means between said pressing member and said mounting member, said pressing member having an insertion hole into which said electrical connection terminal is inserted; and a cylindrical member projected from a circumference of said insertion hole and fitted to said cylindrical portion of said shield package.

7. The laser beam emitting device according to claim 6, wherein said pressing member includes a plate member having a convex portion by which said laser beam emitting means is pressed against said mounting member.

8. The laser beam emitting device according to claim 7, wherein the convex portion of said pressing member is formed like a ring along a circumference of said insertion hole.

9. The laser beam emitting device according to claim 8, wherein said mounting member has an insertion hole communicating with said mounting hole, said insertion hole has a small-diameter cylindrical portion into which the front portion of said laser beam emitting means is inserted, a large-diameter cylindrical portion into which the back portion of said laser beam emitting means is inserted, and a step portion arranged therebetween, and said back portion is pressed against said step portion by the convex portion of said pressing member within the large-diameter cylindrical portion.

10. A laser beam emitting device comprising:

a laser beam emitter including a front portion for emitting a laser beam, a back portion serving as a heat sink, and an electrical connection terminal projected from the back portion;

control means for controlling said laser beam emitter, said control means having a high-frequency electrical circuit connected to the electrical connection terminal;

a base having a mounting hole for guiding the laser beam emitted from said laser beam emitter;

a mounting member for mounting said laser beam emitter on said mouting hole;

a mounting member for mounting said laser beam emitter against said mounting member, said pressing member including a plate member having a convex portion to engage and press said laser beam emitter against said mounting member, said pressing member also having an insertion hole to receive said electrical connection terminal; and a cylindrical member projected from a circumference of said insertion hole, for electrically shielding said control means.

* * * * *